US009431433B2

(12) United States Patent
Xia et al.

(10) Patent No.: US 9,431,433 B2
(45) Date of Patent: Aug. 30, 2016

(54) TFT ARRAY SUBSTRATE, DISPLAY PANEL AND DISPLAY DEVICE (71) Applicants: Xiamen Tianma Micro-Electronics Co., Ltd., Xiamen (CN); Tianma Micro-Electronics Co., Ltd., Shenzhen (CN)

(72) Inventors: Jun Xia, Xiamen (CN); Li Zhou, Xiamen (CN)

(73) Assignees: Xiamen Tianma Micro-Electronics Co., Ltd., Xiamen (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 14/469,464

(22) Filed: Aug. 26, 2014

(65) Prior Publication Data
US 2015/0294987 A1  Oct. 15, 2015

(30) Foreign Application Priority Data
Apr. 9, 2014  (CN) .......................... 2014 1 0139598

(51) Int. Cl.
H01L 29/24      (2006.01)
H01L 31/036     (2006.01)
H01L 27/12      (2006.01)
H01L 23/552     (2006.01)

(52) U.S. Cl.
CPC .......... *H01L 27/124* (2013.01); *H01L 23/552* (2013.01); *H01L 2924/0002* (2013.01)

(58) Field of Classification Search
CPC ... H01L 29/24; H01L 31/036; H01L 21/775; H01L 27/12; H01L 29/66575; H01L 29/78621
USPC .......................................................... 257/72
See application file for complete search history.

(56) References Cited

U.S. PATENT DOCUMENTS

| 2006/0071243 | A1* | 4/2006 | Hsu | H01L 27/124 257/223 |
| 2009/0040243 | A1* | 2/2009 | Hisada | G09G 3/3614 345/690 |
| 2009/0051859 | A1* | 2/2009 | Sugiyama | G02F 1/133512 349/106 |
| 2010/0026931 | A1* | 2/2010 | Yokoyama | G02F 1/133605 349/62 |
| 2011/0170043 | A1* | 7/2011 | Lim | G02F 1/13452 349/116 |
| 2011/0304604 | A1* | 12/2011 | Jo | G09G 3/3677 345/212 |
| 2012/0008073 | A1* | 1/2012 | Ota | G02F 1/134336 349/106 |
| 2013/0242217 | A1* | 9/2013 | Naoe | G02F 1/13439 349/41 |
| 2014/0332769 | A1* | 11/2014 | Lee | H01L 27/3272 257/40 |

* cited by examiner

FOREIGN PATENT DOCUMENTS

CN      202771135 U     3/2013
KR      20050097005 A   10/2005

*Primary Examiner* — Phuc Dang
(74) *Attorney, Agent, or Firm* — Alston & Bird LLP (57) ABSTRACT A TFT array substrate, a display panel and a display device are disclosed. The TFT array substrate includes a substrate, a display area and a peripheral area surrounding the display area. The display area and the peripheral area are arranged above the substrate. The peripheral area comprises a signal line and a shielding layer arranged above the signal line, and the shielding layer covers the signal line to shield EMI caused by a signal on the signal line. The TFT array substrate, the display panel and the display device can protect the display panel against EMI caused by the signal on the signal lines in the peripheral area, thereby improving stability and reliability of the TFT array substrate, the display panel and the display device, and enhancing sensitivity of a cellphone having the display panel.

19 Claims, 4 Drawing Sheets

TFT ARRAY SUBSTRATE, DISPLAY PANEL AND DISPLAY DEVICE

CROSS-REFERENCES TO RELATED APPLICATIONS

This application claims the benefit of priority to Chinese Patent Application No. 201410139598.2, filed with the Chinese Patent Office on Apr. 9, 2014 and entitled "TFT ARRAY SUBSTRATE, DISPLAY PANEL AND DISPLAY DEVICE, the content of which is incorporated herein by reference in its entirety.

TECHNICAL FIELD

The present application relates to the field of display technologies, in particular to a Thin Film Transistor (TFT) array substrate, a display panel and a display device.

BACKGROUND OF THE INVENTION

Due to their advantages such as a low voltage, low power consumption, a large amount of displayed information, and easy colorization, Thin Film Transistor Liquid Crystal Displays (TFT-LCDs) have become the mainstream in the current display field, and have been widely used in various electronic devices such as computers, laptops, mobile phones, cameras, and high-definition televisions.

Currently, liquid crystal display panels in a Fringe Field Switching (FFS) mode and an In Plane Switching (IPS) mode are present in TFT-LCD products.

Figure 1:
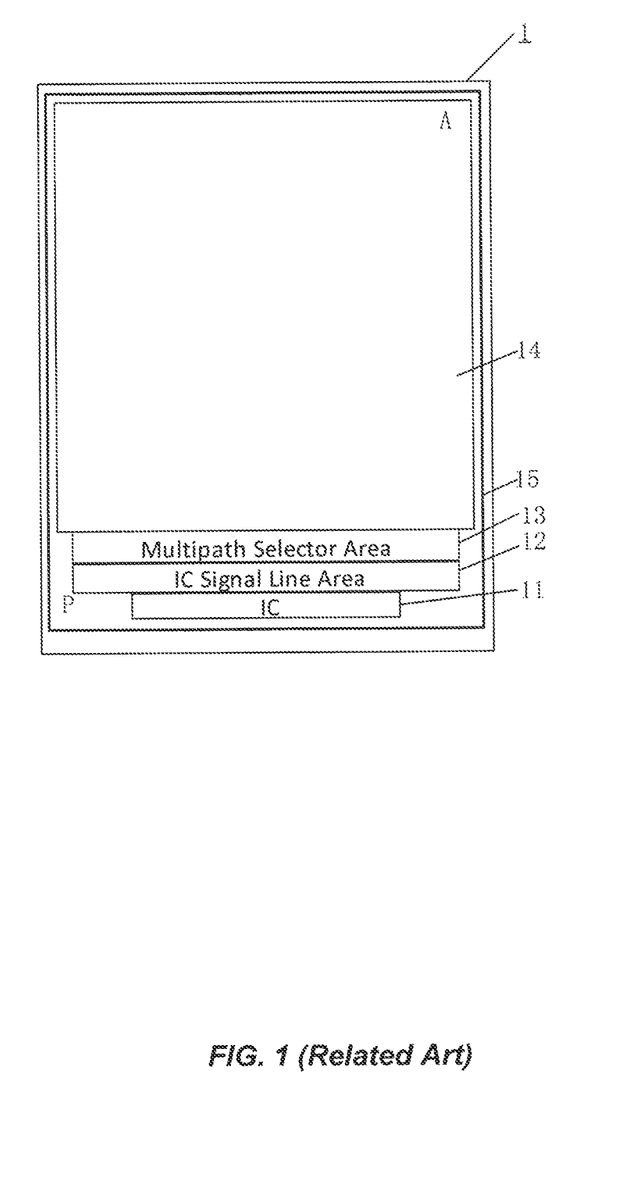
FIG. 1 is a schematic diagram of an array substrate in the related art.

A conventional liquid crystal display panel includes an array substrate and a color filter substrate disposed opposite to the array substrate, and a liquid crystal material is filled between the array substrate and the color filter substrate. The array substrate includes a display area A for displaying and a peripheral area P surrounding the display area A. FIG. 1 is a schematic diagram showing an array substrate in the related art. As shown in FIG. 1, the array substrate 1 includes the display area A and the peripheral area P surrounding the display area A. The peripheral area P is defined by an area between an outside edge of the array substrate 1 and a boundary of the display area A, and includes an Integrated Circuit (IC) 11, an IC signal line area 12, and a multipath selector area 13, where, the IC signal line area 12 is electrically connected with the IC 11 and the multipath selector area 13, respectively. A plane common electrode 14 is provided within the display area A of the array substrate. The plane common electrode 14, which may be generally formed by a transparent conductive film, may be deposited in a film-forming manner within the whole area of the display area A (as shown in FIG. 1), or within a part of the display area A. In the related art, in order to shield environmental electromagnetic interference (EMI) with the display panel, a closed grounding line (GND) 15, which is generally used by a metal wire, is provided within the peripheral area. But in manufacturing processes, the inventors discovered that if the display panel was subjected to intensive EMI, in particular a clock signal line would be subjected to intensive EMI, when a signal inputted from the IC signal line in the peripheral area P to the display area A fluctuates, thus negatively effecting stability and reliability of the display panel significantly. When the display panel is a liquid crystal display panel, if the EMI from the signal line is not eliminated, then fringe interference is caused to an image displayed in the liquid crystal display panel, or even color shift is caused to the image or the liquid crystal display gets a blank screen when the electronic device is booting, or worse yet, the electronic device doesn't work. When the display panel is used in the manufacture of an electronic device such as a cellphone, signals generated in the display panel may cause severe EMI to radio frequency signals in the cellphone, thereby severely degrading the cellphone sensitivity.

BRIEF SUMMARY OF THE INVENTION

An embodiment of the present disclosure provides a TFT array substrate, which includes: a substrate; a display area and a peripheral area surrounding the display area, both disposed on the substrate. The peripheral area comprises a signal line and a shielding layer arranged above the signal line, and the shielding layer covers the signal line to shield the display area against EMI caused by a signal outputted by the signal line.

An embodiment of the present disclosure provides a display panel, which includes the above-described TFT array substrate.

An embodiment of the present disclosure provides a display device, which includes the above-described display panel.

BRIEF DESCRIPTION OF THE DRAWINGS

Exemplary embodiments of the present disclosure will be described in detail below with reference to the accompanying drawings to provide a better understanding of the nature and advantages of the present invention.

DETAILED DESCRIPTION OF THE INVENTION

The present disclosure will be described in detail through embodiments below in conjunction with the accompanying drawings. It should be understood that specific embodiments described herein are merely for explaining the present disclosure rather than limiting the present disclosure. In addition, it should be noted that merely partial content associated with the present disclosure rather than all contents is illustrated in the accompanying drawings, and the accompanying drawings are not drawn to scale, and similar reference numbers are used for representing similar elements.

Figure 2:
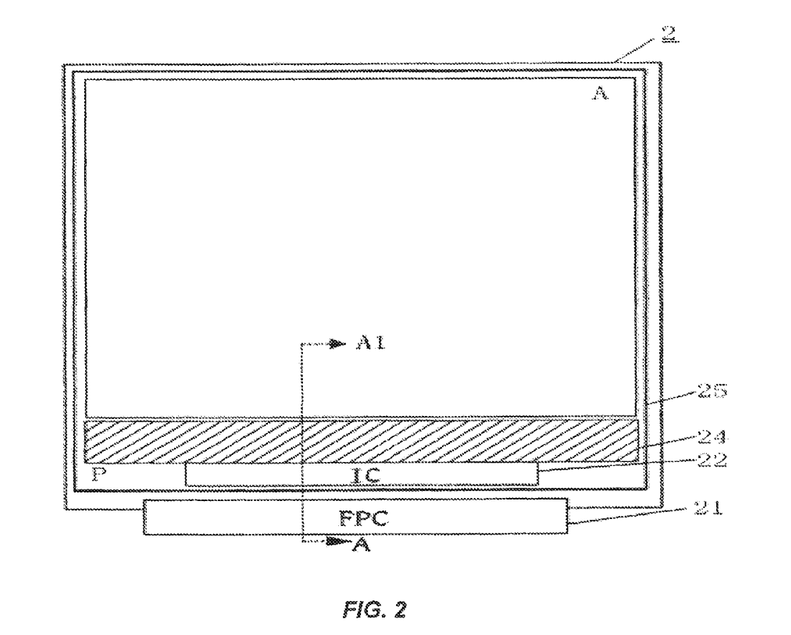
FIG. 2 is a schematic diagram of a TFT array substrate according to an embodiment of the present disclosure.
Figure 3:
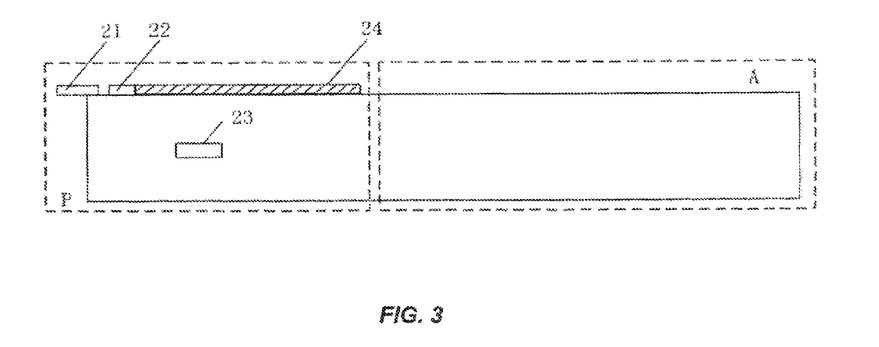
FIG. 3 is a schematic sectional diagram of the TFT array substrate taken along the line A-A1 in FIG. 2.

FIGS. 2 and 3 show a TFT array substrate according to an embodiment of the present disclosure.

FIG. 2 is a schematic diagram of the TFT array substrate according to an embodiment of the present disclosure. FIG. 3 is a schematic sectional diagram of the TFT array substrate taken along the line A-A1 in FIG. 2 according to the embodiment of the present disclosure, and the description of an embodiment of the present disclosure now is detailed below with reference to FIG. 2 and FIG. 3.

Referring to FIGS. 2 and 3, the TFT array substrate 2 includes a display area A and a peripheral area P surrounding the display area A, that is, the peripheral area P is defined by an area between an outside edge of the TFT array substrate 2 and a boundary of the display area A. Wiring or other elements such as a flexible printed circuit (FPC) 21, an integrated circuit (IC) 22 and various signal lines 23 (not shown in FIG. 2) may be provided in the peripheral area P. In addition, the peripheral area P includes a shielding layer 24 formed above an area at which the signal lines 23 are located, and the shielding layer 24 covers the area at which the signal lines are located. When the peripheral area P includes the flexible printed circuit 21 or the integrated circuit 22, the flexible printed circuit 21 or the integrated circuit 22 can be electrically connected to the shielding layer 24 to provide an electric potential to the shielding layer 24.

In the embodiment, when the signal on the signal lines 23 is switched from a logic high level to a logic low level or from the logic low level to the logic high level, the signal lines generate an electric field and a magnetic field, which create the EMI for the TFT array substrate. The shielding layer 24 can shield a signal from the signal lines 23 below the shielding layer 24, thereby protecting the display panel against the EMI caused by the signal or by change of the signal.

The electrical connection of the flexible printed circuit 21 or the integrated circuit 22 to the TFT array substrate may be implemented by a direct or indirect electrical connection between the flexible printed circuit 21 or the integrated circuit 22 and the TFT array substrate. In an implementation, the shielding layer 24 may be electrically connected to an electric potential for a better shielding effect. When the TFT array substrate is electrically connected directly to the flexible printed circuit 21 or the integrated circuit 22, the flexible printed circuit 21 can be electrically connected directly to the shielding layer 24 to provide an electric potential for the shielding layer 24. Alternatively, the electric potential may be provided to the shielding layer 24 by means of an indirect electrical connection, for example, the flexible printed circuit 21 is electrically connected to other portion of the TFT array substrate, to provide the electrical potential to the shielding layer 24 by means of a via hole, and the like. In a preferred embodiment, the flexible printed circuit 21 or the integrated circuit 22 is electrically connected directly to the shielding layer 24 to provide an electric potential to the shielding layer 24.

In some implementations, the electric potential provided for the shielding layer 24 may be in a range from +0.5V to −0.5V. In some other implementations, the electric potential provided for the shielding layer 24 is 0V. Based on research of the inventors, at this time, the shielding layer can efficiently shield the EMI caused by the signal from the signal lines, without increasing power consumption of the TFT array substrate.

Optionally, the peripheral area P of the TFT array substrate can further include a GND line (grounding line) 25 (not shown in FIG. 3), which is a closed wiring surrounding the display area A to further shield the EMI. The display panel can be better protected against the EMI caused by the signal from the signal lines based on the above structure employing the GND line.

It should be understood by those skilled in the art that the TFT array substrate described herein is merely for explaining the present disclosure rather than limiting the present disclosure. The peripheral area P of the used TFT array substrate may include, but not merely limited to or necessarily include the flexible printed circuit 21, the integrated circuit 22 and various signal lines 23. The present embodiment is merely an exemplary embodiment, and all existing structures of the TFT array substrate may be adapted to the present disclosure. Alternatively, FIGS. 2 and 3 merely show a viable type of the structure and wiring of the TFT array substrate, but the TFT array substrate is not necessarily limited to this specific structure and does not necessarily include each element shown in Figures, or the TFT array substrate does not necessarily employ merely such wiring, thus the exemplary structure of the TFT array substrate in FIG. 2 or FIG. 3 should not limit the embodiment of the present disclosure.

It is noted that the signal line 23 is just schematically illustrated below the shielding layer 24 in FIG. 3. Considering that the TFT array substrate can have various structures, the TFT array substrate can have diversified film layers accordingly. Specific film layers or structures around the signal line are not defined in the present embodiment, while the shielding layer 24 is arranged above the signal lines 23 and electrically insulated from the signal lines 23. Therefore, FIG. 3 should not limit the structure of the present embodiment. In order to clearly show emphasis of the present embodiment, irrelevant film layers in the display area A of the TFT array substrate in FIGS. 2 and 3 are omitted herein for the sake of clarity.

The present embodiment further provides a display panel including the TFT array substrate described in any of the above embodiments. In an implementation, the display panel is a liquid crystal display panel. When the display panel including the TFT array substrate described in any of the above embodiments is applied in manufacturing an electronic device such as a cellphone, EMI caused for communication signals in the electronic device such as the cellphone can be reduced, thereby improving the cellphone sensitivity.

Furthermore, the present embodiment further provides a display device including the display panel described in any of the above embodiments. In an implementation, the display device is a liquid crystal display device including the display panel and a backlight unit, of course, the display device may be other type, for example, a display device without a backlight unit.

In the TFT array substrate, the display panel and the display device according to the embodiment of the present disclosure, a shielding layer covering the signal lines in the peripheral area is disposed above the signal lines to shield the EMI caused by the signal on the signal lines, thereby improving stability and reliability of the TFT array substrate, the display panel and the display device.

Figure 4:
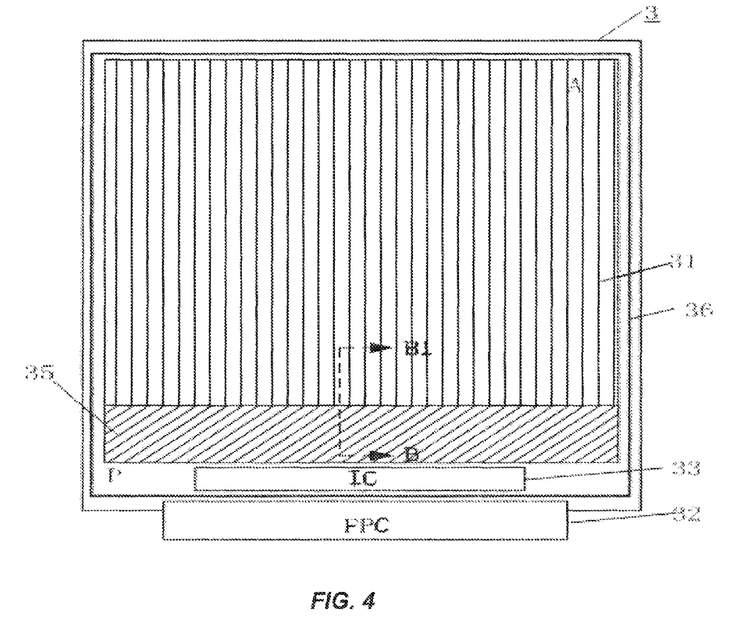
FIG. 4 is a schematic diagram of a TFT array substrate according to an embodiment of the present disclosure.
Figure 5:
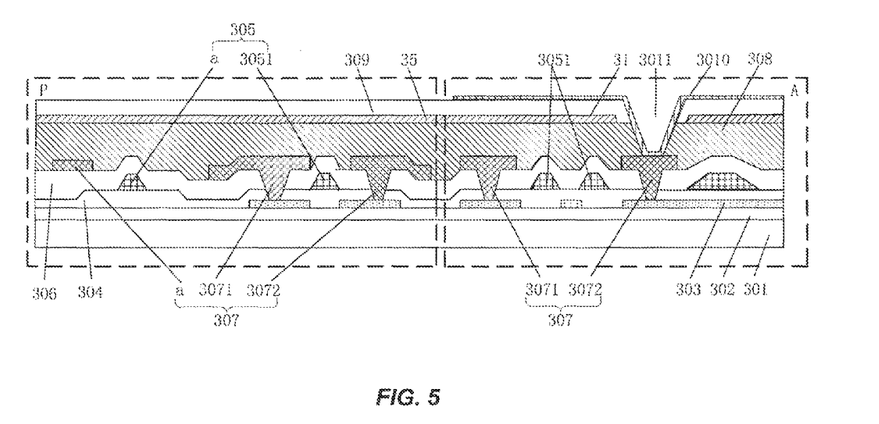
FIG. 5 is a schematic sectional diagram of the TFT array substrate taken along the line B-B1 in FIG. 4.

FIG. 4 is a schematic diagram of a TFT array substrate according to an embodiment of the present disclosure, FIG. 5 is a schematic sectional diagram of the TFT array substrate taken along the line B-B1 in FIG. 4 according to the embodiment of the present disclosure.

Referring to FIG. 4, a TFT array substrate 3 includes a display area A and a peripheral area P surrounding the display area A, that is, the peripheral area P is defined by an area between an outside edge of the TFT array substrate 3 and a boundary of the display area A. Wirings or other elements such as a flexible printed circuit 32, an integrated circuit 33 and various signal lines (not shown in FIG. 4) are disposed in the peripheral area P. In addition, the peripheral area P includes a shielding layer 35 formed above an area at which the signal lines are located, and the shielding layer 35 covers the area at which the signal lines are located, to protect the display panel against the EMI caused by the signal from each of the signal lines within the area at which the signal lines are located. In the present embodiment, referring to FIG. 5, the display area A includes a common electrode layer 31, and an electric potential of the shielding layer 35 is equal to that of the common electrode layer 31. Particularly, the shielding layer 35 can be electrically connected to the common electrode layer 31 to get the same electric potential. In another implementation, as shown in FIG. 5, a portion of the common electrode layer 31 within the display area A may extend to the peripheral area P to form the shielding layer 35, that is, the shielding layer 35 within the peripheral area P and the common electrode layer 31 within the display area A are formed by a common film layer, and can be formed using a same process, thereby the electric potential of the shielding layer 35 is the same as that of the common electrode layer 31.

Referring to FIG. 5, the array substrate includes: a substrate 301; a planarization layer 308 disposed above the substrate 301, where the planarization layer 308 covers the display area A and the peripheral area P; and a common electrode layer 31 disposed on the planarization layer 308, is the common electrode layer 31 arranged in the display area A and extends from the display area A to the peripheral area P to shield a signal from the signal line a below the planarization layer 308. The array substrate further includes a first insulation layer 309 which is disposed on the common electrode layer 31 and covers the display area A and the peripheral area P; and a pixel electrode layer 3010 which is disposed on the first insulation layer 309 and electrically connected to a switch device below the planarization layer 308 through a via hole 3011.

In an implementation of the present embodiment, the switch device is a TFT switch device. The common electrode layer 31 within the display area A extends to the peripheral area P to form the shielding layer 35, that is, the common electrode layer 31 within the display area A and the shielding layer 35 in the peripheral area P are in a same layer and formed by the same material. The common electrode and the shielding layer are formed using the same process, so that the electric potential of the shielding layer 35 is equal to that of the common electrode layer 31. The shielding layer 35 can shield the signal from the signal line a below the shielding layer 35, thereby protecting the panel against the EMI caused by the signal.

In an implementation, the array substrate further includes, between the substrate 301 and the planarization layer 308: a buffer layer 302 on the substrate 301; a polysilicon layer 303 on the buffer layer 302; a gate insulation layer 304 covering the polysilicon layer 303; a first electrode 305 on the gate insulation layer 304; a second insulation layer 306 covering the first electrode 305; and a second electrode 307 on the second insulation layer 306, where, the second electrode 307 includes a source 3071 and/or a drain 3072 of the TFT switch device, the source 3071 and/or the drain 3072 is electrically connected to the polysilicon layer 303 through a via hole extending through the second insulation layer 306 and the gate insulation layer 304, and the planarization layer 308 covers the second electrode 307 and the second insulation layer 306. The first electrode 305 includes a gate 3051 of the TFT switch device, and the pixel electrode 3010 is electrically connected to the drain 3072 of the TFT switch device through a via hole 3011 extending through the first insulation layer 309, the common electrode layer 31 and the planarization layer 308. It is noted that the buffer layer 302 can be omitted and the polysilicon layer 303 can be directly arranged on the substrate 301.

It is noted that FIG. 5, which is a schematic diagram of the structures of various film layers, schematically shows the structures of two TFT switch devices. Generally, a TFT switch device electrically connected to the pixel electrode 3010 within the display area A is configured to control the displaying of an image, and a TFT switch device within the peripheral area P is configured to control a signal. Additionally, in the present embodiment, the signal line a may be a metal electrode which is either the first electrode 305 or the second electrode 307, i.e., the signal line a can be formed on either of the two film layers (i.e. on the gate insulation layer or the second insulation layer) in the peripheral area P, and certainly can be disposed at several positions on the two film layers as desired, as indicated in FIG. 5. The signal from the signal lines may be a signal with a pulse waveform, and more particularly a clock signal, and the clock signal may be a horizontal clock signal (CKH) or a vertical clock signal (CKV). The shielding layer 35 can shield the signal from the signal line a below the shielding layer 35, thereby protecting the panel against the EMI caused by the signal.

Optionally, referring to FIG. 4, the peripheral area P of the TFT array substrate can further include a GND line 36, which may be a closed GND line surrounding the display area A to further shield the EMI. The display panel can be better protected against the EMI caused by the signal from the signal lines based on the above structure employing the GND line.

The present embodiment further provides a display panel including the TFT array substrate described in any of the above embodiments. In an implementation, the display panel is a liquid crystal display panel. When the display panel including the TFT array substrate described in any of the above embodiments is applied in manufacturing an electronic device such as a cellphone, EMI caused for a communication signal of the cellphone can be reduced in the cellphone, thereby improving definition of the communication signal of the cellphone.

Furthermore, the present embodiment provides a display device including the display panel described in any of the above embodiments. In an implementation, the display device is a liquid crystal display device including the display panel and a backlight unit. Of course, the display device may be other display device, for example, a display device without a backlight unit.

In the TFT array substrate, the display panel and the display device according to the above embodiment of the present disclosure, the common electrode layer within the display area extends to the peripheral area to form a shielding layer, which covers the signal lines in the peripheral area to shield the EMI caused by the signal from the signal lines, thereby improving stability and reliability of the TFT array substrate, the display panel and the display device.

Figure 6:
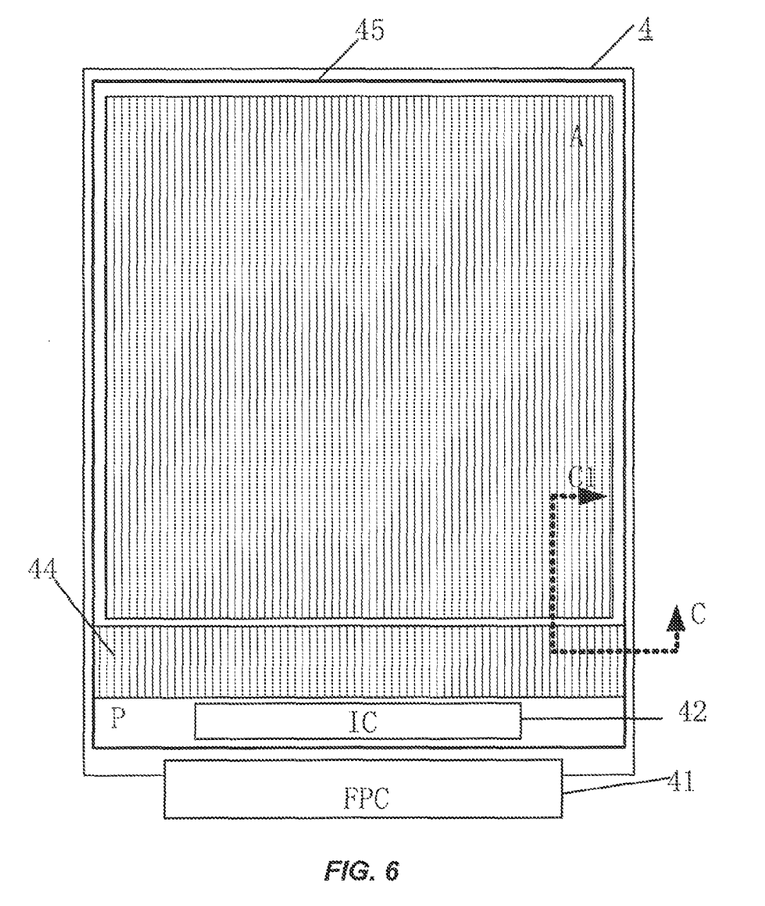
FIG. 6 is a schematic diagram of a TFT array substrate according to an embodiment of the present disclosure.
Figure 7:
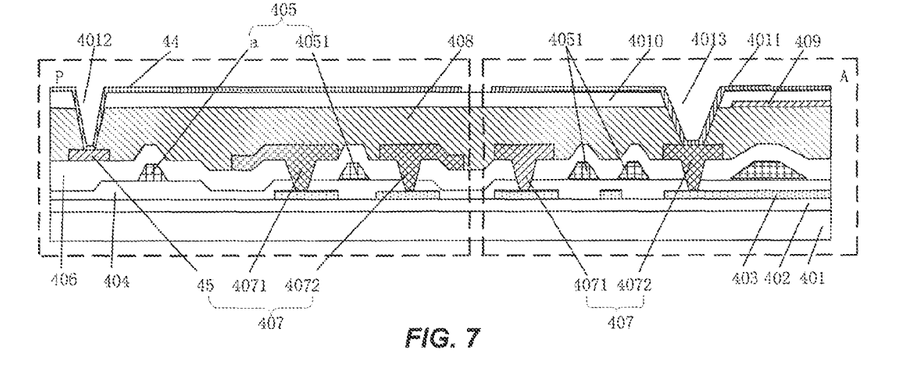
FIG. 7 is a schematic sectional diagram of the TFT array substrate taken along the line C-C1 in FIG. 6.

FIGS. 6 and 7 show a TFT array substrate according to an embodiment of the present disclosure. The embodiment is described in more detail with respect to the above embodiment.

FIG. 6 is a schematic plan view of a TFT array substrate according to the embodiment of the present disclosure, FIG. 7 is a schematic sectional diagram of the TFT array substrate taken along the line C-C$_1$ in FIG. 6 according to the third embodiment of the present disclosure, and the description of the embodiment of the present disclosure now is made with combination of FIG. 6 and FIG. 7.

As shown in FIG. 6, the TFT array substrate 4 includes a display area A and a peripheral area P surrounding the display area A, that is, the peripheral area P is defined by an area between an outside edge of the TFT array substrate 4 and a boundary of the display area A. Wirings or other elements such as a flexible printed circuit 41, an integrated circuit 42 and various signal lines (not shown in FIG. 6) are disposed in the peripheral area P. In addition, the peripheral area P further includes a shielding layer 44 formed above an area at which the signal lines are located, and the shielding layer 44 covers the area at which the signal lines are located, to protect the display panel against the EMI caused by the signal from the each of signal lines within the area at which the signal lines are located. In the present embodiment, the peripheral area P further includes a GND line 45, and the shielding layer 44 may be electrically connected to the GND line 45.

Referring to FIG. 7, the array substrate includes: a substrate 401; a planarization layer 408 above the substrate 401, where the planarization layer 408 covers the display area A and the peripheral area P; a common electrode layer 409 disposed on the planarization layer 408 and in the display area A; a first insulation layer 4010 covering the planarization layer 408 and the common electrode layer 409, where the first insulation layer 4010 covers the display area A and the peripheral area P; a shield layer 44 which is disposed on the first insulation layer 4010 and electrically connected to the GND line 45 below the planarization layer 408 through a via hole 4012; and a pixel electrode 4011 which is disposed on the first insulation layer 4010 and electrically connected to a switch device below the planarization layer 408 through a via hole 4013.

In the present embodiment, the switch device may be a TFT switch device. In the present embodiment, the shielding layer 44 is electrically connected to the GND line 45 in the peripheral area P so that the electric potential of the shielding layer 44 is 0V, and the signal from the signal line a below the shielding layer 35 can be shielded, thereby protecting the panel against the EMI caused by the signal.

In an implementation, the array substrate can further specifically includes, between the substrate 401 and the planarization layer 408: a buffer layer 402 on the substrate 401; a polysilicon layer 403 on the buffer layer 402; a gate insulation layer 404 covering the polysilicon layer 403; a first electrode 405 on the gate insulation layer 404; a second insulation layer 406 covering the first electrode 405; and a second electrode 407 on the second insulation layer 406, where, the second electrode 407 includes a source 4071 or a drain 4072 of the TFT switch device, the source 4071 or the drain 4072 is electrically connected to the polysilicon layer 403 through a via hole extending through the second insulation layer 406 and the gate insulation layer 404, and the planarization layer 408 covers the second electrode 407 and the second insulation layer 406. The first electrode 405 includes a gate 4051 of the TFT switch device, the second electrode 407 may include the GND line 45, the shielding layer 44 is electrically connected to the GND line through the via hole 4012 extending through the first insulation layer 4010 and the planarization layer 408, and the pixel electrode 4011 may be electrically connected to the drain 4072 of the TFT switch device through the via hole 4013 extending through the first insulation layer 4010, the common electrode layer 409 and the planarization layer 408. In an implementation, the pixel electrode 4011 is made of conductive material, and the shielding layer 44 may be made of the same material as the pixel electrode 4011, or by other conductive material, but the present disclosure is not limited thereto. As a variant of the embodiment, the pixel electrode 4011 and the shielding electrode 44 can be formed in the common process by using the same material to simply the process of manufacturing the pixel electrode 4011 and the shielding electrode 44. It is noted that the buffer layer 402 may be omitted, i.e., the polysilicon layer 403 can be directly arranged on the substrate 401.

In the present embodiment, the signal line a may be a metal electrode which is either the first electrode 405 or the second electrode 407, i.e. the signal line a can be formed on either of two film layers (i.e. on the gate insulation layer or the second insulation layer) in the peripheral area P (for example, the signal line a is arranged in the first electrode 405 as shown in FIG. 7), or arranged on both of the two film layers. The signal from the signal line a may be a signal with a pulse waveform, and more particularly a clock signal, and the clock signal may be a horizontal clock signal (CKH), or a vertical clock signal (CKV). The shielding layer 44 can shield the pulse signal or the clock signal from the signal line a below the shielding layer 44, thereby protecting the panel against the EMI caused by the pulse signal or the clock signal.

The present embodiment further provides a display panel including the TFT array substrate described in any of the above embodiments. In an implementation, the display panel may be a liquid crystal display panel. When the display panel including the TFT array substrate described in any of the above embodiments is applied in manufacturing an electronic device such as a cellphone, EMI caused for a communication signal of the cellphone can be reduced in the cellphone, thereby improving definition of the communication signal of the cellphone.

Furthermore, the present embodiment further provides a display device including the display panel described in any of the above embodiments. In an implementation, the display device may be a liquid crystal display device including the display panel and a backlight unit, of course, may be other display device, for example, a display device without backlight unit.

In the TFT array substrate, the display panel and the display device according to the third embodiment of the present disclosure, a shielding layer is electrically connected to the GND line in the peripheral area and covers the signal lines in the peripheral area to shield the display panel against EMI caused by the signal on the signal lines, thereby improving stability and reliability of the TFT array substrate, the display panel and the display device.

It is noted that the preferable embodiments and the applied technology principles of the present disclosure are merely described as above. It should be understood for those skilled in the art that the present disclosure is not limited to particular embodiments described herein. Various apparent changes, readjustment and alternative can be made by those skilled in the art without departing the scope of protection of the present disclosure. Therefore, although the present disclosure is illustrated in detail through the above embodiments, the present disclosure is not limited to the above embodiments, and can further include other equivalent embodiments without departing the conception of the present disclosure. The scope of the present disclosure is subject to the appended claims.

What is claimed is:

1. A TFT array substrate, comprising:
   a substrate;
   a display area disposed on the substrate; and
   a peripheral area surrounding the display area and disposed on the substrate, the peripheral area comprising:
      a signal line; and
      a shielding layer disposed on the signal line and covering the signal line, the shielding layer shielding the display area against electromagnetic interference (EMI) caused by a signal outputted by the signal line,
wherein, the peripheral area further comprises an integrated circuit or a flexible printed circuit electrically connected to the substrate, and the electric potential of the shielding layer being provided by the integrated circuit or the flexible printed circuit.

2. The TFT array substrate of claim 1, wherein the display area comprises a common electrode layer, and the electric potential of the shielding layer is equal to an electric potential of the common electrode layer.

3. The TFT array substrate of claim 2, wherein the common electrode layer in the display area is extended to the peripheral area to form the shielding layer.

4. The TFT array substrate of claim 3, further comprising:
a planarization layer, disposed on the substrate and covering the display area and the peripheral area;
a common electrode, disposed on the planarization layer and in the display area, and extending from the display area to the peripheral area to shield the signal outputted by the signal line;
a first insulation layer, disposed on the common electrode layer and covering the display area and the peripheral area; and
a pixel electrode layer, disposed on the first insulation layer and electrically connected to a TFT switch device below the planarization layer through a via hole.

5. The TFT array substrate of claim 4, further comprising, between the substrate and the planarization layer:
a polysilicon layer on the substrate;
a gate insulation layer covering the polysilicon layer;
a first electrode disposed on the gate insulation layer and comprising a drain of the TFT switch device;
a second insulation layer covering the first electrode;
a second electrode disposed on the second insulation layer and comprising a source or a drain of the TFT switch device, the source or the drain being electrically connected to the polysilicon layer through a via hole extending through the second insulation layer and the gate insulation layer; and
the planarization layer covering the second electrode and the second insulation layer;
wherein the pixel electrode is electrically connected to the drain of the TFT switch device through a via hole extending through the first insulation layer, the common electrode layer and the planarization layer.

6. The TFT array substrate of claim 5, wherein the first electrode or the second electrode comprises the signal line.

7. The TFT array substrate of claim 1, further comprising a GND line in the peripheral area and electrically connected to the shield layer.

8. The TFT array substrate of claim 7, further comprising:
a planarization layer disposed on the substrate and covering the display area and the peripheral area;
a common electrode layer disposed on the planarization layer and in the display area;
a first insulation layer covering the planarization layer and the common electrode layer, the common electrode layer covering the display area and the peripheral area;
a shield layer disposed on the first insulation layer and electrically connected to the GND line below the planarization layer through a via hole; and
a pixel electrode disposed on the first insulation layer and electrically connected to a TFT switch device below the planarization layer through a via hole.

9. The TFT array substrate of claim 8, further comprising, between the substrate and the planarization layer:
a polysilicon layer above the substrate;
a gate insulation layer covering the polysilicon layer;
a first electrode disposed on the gate insulation layer and comprising a drain of the TFT switch device;
a second insulation layer covering the first electrode;
a second electrode disposed on the second insulation layer and comprising a source or a drain of the TFT switch device, the source or the drain being electrically connected to the polysilicon layer through a via hole extending through the second insulation layer and the gate insulation layer; and
the planarization layer covering the second electrode and the second insulation layer;
wherein the second electrode comprises the GND line, and the shielding layer is electrically connected to the GND line through a via hole extending through the first insulation layer and the planarization layer;
the pixel electrode is electrically connected to the drain of the TFT switch device through a via hole extending through the first insulation layer, the common electrode layer and the planarization layer.

10. The TFT array substrate of claim 9, wherein the first electrode or the second electrode comprises the signal line.

11. The TFT array substrate of claim 1, wherein the signal line is a clock signal line.

12. The TFT array substrate of claim 1, wherein the shielding layer is made of conducting material.

13. A display panel comprising a TFT array substrate, wherein the TFT array substrate comprises:
a substrate;
a display area disposed on the substrate; and
a peripheral area surrounding the display area and disposed on the substrate, the peripheral area comprising:
a signal line; and
a shielding layer disposed on the signal line and covering the signal line, the shielding layer shielding the display area against electromagnetic interference (EMI) caused by a signal outputted by the signal line,
wherein, the peripheral area further comprises an integrated circuit or a flexible printed circuit electrically connected to the substrate, and the electric potential of the shielding layer being provided by the integrated circuit or the flexible printed circuit.

14. The display panel of claim 13, wherein the display area comprises a common electrode layer, and the electric potential of the shielding layer is equal to an electric potential of the common electrode layer.

15. The display panel of claim 13, further comprising a GND line in the peripheral area and electrically connected to the shield layer.

16. The display panel of claim 13, wherein the shielding layer is made of conducting material.

17. A display device comprising a display panel, the display panel comprising a TFT array substrate, wherein the TFT array substrate comprise:
a substrate;
a display area disposed on the substrate; and
a peripheral area surrounding the display area and disposed on the substrate, the peripheral area comprising:
a signal line; and
a shielding layer disposed on the signal line and covering the signal line, the shielding layer shielding the display area against electromagnetic interference (EMI) caused by a signal outputted by the signal line,
wherein, the peripheral area further comprises an integrated circuit or a flexible printed circuit electrically connected to the substrate, and the electric potential of the shielding layer being provided by the integrated circuit or the flexible printed circuit.

18. The display device of claim 17, wherein the display area comprises a common electrode layer, and the electric potential of the shielding layer is equal to an electric potential of the common electrode layer.

19. The display device of claim 17, wherein the shielding layer is made of conducting material.

* * * * *